US009432228B2

United States Patent
Pashay-Kojouri et al.

(10) Patent No.: US 9,432,228 B2
(45) Date of Patent: Aug. 30, 2016

(54) DIGITAL PRE-DISTORTION FILTER SYSTEM AND METHOD

(71) Applicant: Intel Corporation, Santa Clara, CA (US)

(72) Inventors: Majid Pashay-Kojouri, Irvine, CA (US); Richard Maiden, Mission Viejo, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/923,709

(22) Filed: Oct. 27, 2015

(65) Prior Publication Data

US 2016/0112222 A1  Apr. 21, 2016

Related U.S. Application Data

(63) Continuation of application No. 13/618,607, filed on Sep. 14, 2012, now Pat. No. 9,210,009.

(60) Provisional application No. 61/535,208, filed on Sep. 15, 2011.

(51) Int. Cl.
*H04B 15/00* (2006.01)
*H04L 25/49* (2006.01)

(52) U.S. Cl.
CPC .............. *H04L 25/49* (2013.01); *H04B 15/00* (2013.01)

(58) Field of Classification Search
CPC .. H03F 1/3211; H03F 1/3217; H03F 1/3241; H04L 25/08; H04L 27/367; H04L 25/49; H04B 15/00
See application file for complete search history.

(56) References Cited

U.S. PATENT DOCUMENTS

| 5,900,778 | A  | 5/1999  | Stonick et al.  |
| 6,178,210 | B1 | 1/2001  | Craig et al.    |
| 6,879,641 | B2 | 4/2005  | Unger           |
| 6,922,104 | B2 | 7/2005  | Maniwa          |
| 6,973,141 | B1 | 12/2005 | Isaksen et al.  |
| 7,313,199 | B2 | 12/2007 | Gupta et al.    |
| 7,346,134 | B2 | 3/2008  | Smith           |
| 7,418,056 | B2 | 8/2008  | Suzuki et al.   |

(Continued)

FOREIGN PATENT DOCUMENTS

| CN | 104205704 A | 12/2014 |
| EP | 1983659 A2  | 10/2008 |

(Continued)

OTHER PUBLICATIONS

U.S. Appl. No. 13/618,607, filed Sep. 14, 2012, Digital Pre-Distortion Filter System and Method.
U.S. Appl. No. 13/618,607, Advisory Action mailed Dec. 10, 2014, 3 pgs.
U.S. Appl. No. 13/618,607, Examiner Interview Summary mailed Nov. 26, 2014, 3 pgs.
U.S. Appl. No. 13/618,607, Examiner Interview Summary mailed Dec. 10, 2014, 2 pgs.

(Continued)

*Primary Examiner* — Jean B Corrielus
(74) *Attorney, Agent, or Firm* — Schwegman Lundberg & Woessner, P.A.

(57) ABSTRACT

A digital predistorter for improving the performance of a narrow passband filter near the output is disclosed. The digital predistorter provides amplitude correction to the signal based on the characteristics of the passband filter. A filter group delay predistorter may also be employed to correct group delay variation introduced by the narrow passband filter.

22 Claims, 9 Drawing Sheets

(56) References Cited

U.S. PATENT DOCUMENTS

| | | |
|---|---|---|
| 7,555,058 B2 | 6/2009 | Hori et al. |
| 7,907,678 B2 | 3/2011 | Mizuta et al. |
| 7,929,715 B2 | 4/2011 | Na |
| 7,962,174 B2 | 6/2011 | Lipowski et al. |
| 7,978,749 B2 | 7/2011 | Mccallister |
| 8,121,203 B1* | 2/2012 | Fitton ................ H04L 27/2613 375/260 |
| 2001/0052816 A1 | 12/2001 | Ahn |
| 2002/0085647 A1 | 7/2002 | Oishi et al. |
| 2003/0053552 A1 | 3/2003 | Hongo et al. |
| 2003/0197559 A1 | 10/2003 | Ghannouchi et al. |
| 2004/0042569 A1 | 3/2004 | Casabona et al. |
| 2004/0116083 A1 | 6/2004 | Suzuki et al. |
| 2005/0059360 A1 | 3/2005 | Kenington |
| 2005/0136859 A1* | 6/2005 | Anvari ................ H04B 1/0475 455/114.3 |
| 2006/0008015 A1* | 1/2006 | Marsili .................... H04K 1/00 375/260 |
| 2006/0012427 A1 | 1/2006 | Nezami |
| 2006/0078065 A1 | 4/2006 | Cai et al. |
| 2006/0122814 A1* | 6/2006 | Beens ................ G06F 15/7864 702/189 |
| 2008/0049868 A1 | 2/2008 | Brobston |
| 2008/0159370 A1 | 7/2008 | Atherton |
| 2008/0260066 A1* | 10/2008 | Cai ...................... H03F 1/3294 375/297 |
| 2009/0309678 A1 | 12/2009 | Yu et al. |
| 2011/0092173 A1 | 4/2011 | Mccallister et al. |
| 2012/0093210 A1* | 4/2012 | Schmidt ............ H04L 27/2624 375/224 |
| 2012/0281556 A1 | 11/2012 | Sayana et al. |
| 2013/0070870 A1 | 3/2013 | Pashay-Kojouri et al. |

FOREIGN PATENT DOCUMENTS

| | | |
|---|---|---|
| EP | 2756622 A1 | 7/2014 |
| WO | WO2013/040465 A1 | 3/2013 |

OTHER PUBLICATIONS

U.S. Appl. No. 13/618,607, Final Office Action mailed May 27, 2014, 22 pgs.

U.S. Appl. No. 13/618,607, Final Office Action mailed Jul. 6, 2015, 10 pgs.

U.S. Appl. No. 13/618,607, Non Final Office Action mailed Feb. 24, 2015, 12 pgs.

U.S. Appl. No. 13/618,607, Non Final Office Action mailed Oct. 4, 2013, 21 pgs.

U.S. Appl. No. 13/618,607, Notice of Allowance mailed Jul. 31, 2015, 11 pgs.

U.S. Appl. No. 13/618,607, Response filed Apr. 4, 2014 to Non Final Office Action mailed Oct. 4, 2013, 8 pgs.

U.S. Appl. No. 13/618,607, Response filed May 26, 2015 to Non Final Office Action mailed Feb. 24, 2015, 11 pgs.

U.S. Appl. No. 13/618,607, Response filed Nov. 20, 2014 to Final Office Action mailed May 27, 2014, 10 pgs.

U.S. Appl. No. 13/618,607, Response filed Nov. 26, 2014 to Final Office Action mailed May 27, 2014, 12 pgs.

European Application Serial No. 12831319.4, Extended European Search Report mailed May 29, 2015, 8 pgs.

European Application Serial No. 12831319.4, Office Action mailed May 2, 2014, 3 pgs.

European Application Serial No. 12831319.4, Response filed Nov. 3, 2014 to Office Action mailed May 2, 2014, 5 pgs.

International Application Serial No. PCT/US2012/055588, International Preliminary Report on Patentability mailed Jan. 16, 2014, 9 pgs.

International Application Serial No. PCT/US2012/055588, International Search Report mailed Nov. 27, 2012, 2 pgs.

International Application Serial No. PCT/US2012/055588, Written Opinion mated Nov. 27, 2012, 7 pgs.

* cited by examiner

DIGITAL PRE-DISTORTION FILTER SYSTEM AND METHOD

RELATED APPLICATION INFORMATION

The present application is a continuation of U.S. patent application Ser. No. 13/618,607, filed Sep. 14, 2012, now issued as U.S. Pat. No. 9,210,009, which claims priority under 35 U.S.C. 119(e) to U.S. Provisional Patent Application Ser. No. 61/535,208 filed Sep. 15, 2011, the disclosure of which is incorporated herein by reference in its entirety.

BACKGROUND OF THE INVENTION

1. Field of the Invention

The present invention relates in general to predistortion linearized communication systems and related methods. More particularly, the invention is directed to transmitters equipped with narrow bandwidth band-pass filters for terrestrial communication networks.

2. Description of the Prior Art and Related Background Information

Wireless network operators are facing ever shrinking spectrum challenges. In high density markets such as that found in larger urban environments, every available kHz of available spectrum has been allocated and used to provide voice and data traffic between mobile user equipment ("UE") and the Base Station ("BS"). To increase wireless capacity, network operators are forced to add carriers and/or split cell sites but eventually are reaching interference limits or are unable to find a suitable location where another BS and its associated equipment (e.g., tower, equipment, antennas, etc) can be installed. Further complicating and limiting the amount of useful spectrum are regulatory interference requirements placed on wireless network operators. Regulatory requirements, such as those mandated by the FCC, stipulate the amount of harmful interference that can be tolerated from BS transmitters operating within its assigned frequency allocation to nearby communication services. In most cases, detected levels of harmful interference levels caused by BS transmitters in nearby communication spectrum must be substantially attenuated and not exceed prescribed levels. To keep the amount of harmful interference from spilling into adjacent communication bands, BS transmitters usually employ highly linear transmitters which keep distortion products at a minimum. Highly linear transmitters utilize power amplifiers which must maintain as linear operation as possible, and the power amplifier is designed to operate within its linear region given the range of possible input signal amplitudes. However if the input signal has an amplitude which causes the power amplifier to operate outside the linear region, the power amplifier introduces nonlinear components or distortion to the signal. Generally, power amplifiers are characterized as having a compression threshold, and input signals having amplitudes above compression threshold are clipped at the amplifier output. In addition to distorting the amplified input signal, the clipping or nonlinear amplification of the input signal generates spectral regrowth which can interfere with communication services in adjacent frequency bands. The problem of nonlinear distortion is very common in wireless communications systems that provide high power amplification of transmit signals with very large peak to average power ratios ("PAR"). In one example of large PAR signals of a code division multiple access ("CDMA") system, a single 1.25 MHz wide carrier can typically have a PAR of 11.3 dB. In another example orthogonal frequency division multiplexing ("OFDM"), multicarrier signals can have a PAR of up to 20 dB.

Unfortunately, the efficiency of the BS amplifier is inversely related to its linearity. To achieve a higher degree of linearity, the amplifiers are biased to operate in the class AB. Numerous techniques and amplifier topologies are used to maximize amplifier RF to DC efficiency, but linearity requirements mandated by modern wireless communication systems dictate the use of class AB modes or combination of AB and C. Consequently, a significant portion of DC power is dissipated by the amplifiers as heat which must be removed. Typically, BS amplifiers use heat sinks and fans to remove heat from RF power devices which further add cost, size, and weight to the base station equipment. Thus, there has been a great deal of effort to reduce the amount of heat generated by BS power amplifiers in a quest to improve amplifier efficiency without degrading amplifier linearity.

When a power amplifier ("PA") is operated with CDMA (or similar signals) at its input, the PA will amplify the desired signal as well as generate unwanted intermodulation ("IM") products. These IM products increase rapidly as the PA output is driven to its saturation point. To achieve the desired linearity at the PA output (without predistortion), the PA must be operated at backoff output power level from its saturation point ($PSAT_{3dB}$). Unfortunately PA operation at backoff power levels limits PA's maximum useful output power level so that the full range of output signal dynamic range is well within the linear region of the PA transfer curve. However, such operating point negatively impacts the PA's efficiency. Efficiencies of 10% or less for conventionally constructed Class AB PAs are not unusual when operated with input signals having 8 to 9 dB peak-to-average ratio PAR while only marginally meeting system linearity requirements.

In view of recent developments in Digital Pre-Distortion ("DPD"), DPD has become a linearization method of choice for Class A/AB PAs transmitting 60 W average power and below. A DPD linearization approach lends itself in solving several previously un-attainable performance limitations such as exhibiting high efficiency with good linearity. These improvements stem from DPD operating point that allows PA's to operate close or even slightly above its $P_{SAT}$ during peak signal transition. DPD usually use techniques where a correction signal is created and amplified along with input signal through the PA's in order to reduce the overall distortion at the output of the PA. A DPD can be an optimized CDMA signal (such as IS-95) which tends to have with a large PAR 9.7 dB (0.01% probability on the CCDF) for a single carrier CDMA with pilot, paging, sync and 6 traffic channels (Walsh codes 8-13). A single channel IS-95 has channel bandwidth 1.23 MHz and DPD generally is optimized to reduce third-order IM products. In such application, DPD can predistort PA so that resultant Adjacent Channel Leakage Ratio ("ACLR") of 48 to 50 dBc at 885-kHz offset, which is typically 14 dB or better over PA ACLR performance operating without predistortion. Similarly, a DPD can be also be optimized to provide cancellation performance for a four carrier WCDMA input signal over a 20 MHz signal band. The DPD performance is usually hampered by the memory effects of the PA which potentially limit DPD effectiveness. The memory effects in a PA amplifier stage are defined as a change of the amplitude and phase in distortion components due to the previous signals. However, if the PA is designed with bias circuits that tend to reduce or limit memory effects, DPD can typically provide linearization for a four-carrier WCDMA signal that results in ACLR of 46 to 48 dBc range with 13 dB or better cancellation at 5-MHz offset. In most applications, PA efficiencies above 25 percent for Class AB PAs and to 40 percent or more for Doherty type PAs is achievable.

Given that DPD linearization can provide ACLR performance additional attenuation of IM products into adjacent spectrum can be achieved by providing a bandpass filter or in case of FDD system duplexer can be implemented in the output of the RRH.

In a typical FDD implementation, a cavity duplexer provides isolation between receiver and transmitter of the RRH as well as adequate degree of TX IM rejection into adjacent spectrum. Since a duplexer is generally required for FDD RRH, its inclusion introduces a host of issues, such as additional output insertion loss and filter pass band response ripple on the transmitted signal quality. The latter manifests itself in an operational situation where CDMA carrier is positioned close to filter roll-off or a band edge. This usually takes place when a network operator configures a CDMA (or WCDMA) carrier in its allocated frequency spectrum in close proximity to the band edge. When such carrier frequency is selected, the net effect of the filter roll-off characteristic impacts CDMA carrier flatness which in turn degrades Rho ("ρ"). The Rho of the BS is figure of merit which is a measure of modulation quality of the transmitted CDMA signal. A Rho of 1.0 is associated with an ideal transmitted signal, essentially all of the power in the CDMA carrier is being transmitted correctly without any multipath. The CDMA standard calls for Rho>0.912 and, in practice, BS transmitter measurements Rho>0.94 indicate a normal BS transmitter operation.

For BS operating W-CDMA air standard (per 3GPP) BS transmitter quality can be summarized in the table below:

| 3GPP Requirements | |
| --- | --- |
| 3GPP | Requirement Limits |
| EVM | 17.5% |
| PCDE | −33 dB |
| ACLR1 | 45 dB |
| ACLR2 | 50 dB |

The Error Vector Magnitude is a measure of the difference between the reference waveform and the measured waveform. This difference is called the error vector. Both waveforms pass through a matched Root Raised Cosine filter with bandwidth 3.84 MHz and roll-off $\alpha=0.22$. Both waveforms are then further modified by selecting the frequency, absolute phase, absolute amplitude and chip clock timing so as to minimize the error vector. The EVM result is defined as the square root of the ratio of the mean error vector power to the mean reference power expressed as a percentage ("%"). The EVM measurement in the test set compares the received signal's IQ modulation characteristics to an ideal signal, as defined in 3GPP TS 34.121 section 5.13 and annex B.

Introduction of a narrow bandpass filter in the output of the BS PA results in CDMA carrier flatness degradation especially if the carrier is positioned close to filter roll off. Typical narrow band pass filters also tend to exhibit rapid group delay change near filter roll-off. The combination of amplitude and group delay variation introduced by the narrow band pass filter degrades Rho and EVM parameters.

Accordingly, a need exists to improve performance in communication systems.

SUMMARY OF THE INVENTION

In a first aspect, the present invention provides a predistortion linearized communication system, comprising an input receiving a digital communication signal, a predistorter coupled to the input, the predistorter outputting a predistorted signal, and an up-conversion module coupled to the predistorter receiving the predistorted signal and outputting an up-converted digital signal. The predistortion linearized communication system further comprises a digital to analog convertor coupled to the up-conversion module receiving the up-converted signal and outputting a RF signal, and a filter coupled to the digital to analog convertor receiving the RF signal and outputting a filtered RF signal. The predistorter outputs the predistorted signal based on the characteristics of the filter.

In a preferred embodiment, the predistorter comprises a finite impulse response filter. In an embodiment, the filter is a passband filter, the communication signal has one or more frequency bands and the predistorter provides a predistortion signal varying with frequency band location relative to the passband filter roll off characteristics. The predistortion linearized communication system preferably further comprises a filter group delay predistorter coupled between the up-conversion module and the digital to analog convertor, wherein the filter group delay predistorter provides an inverse group delay in the up-converted digital signal. The filter group delay predistorter preferably comprises an infinite impulse response filter. The infinite impulse response filter is preferably an all-pass infinite impulse response filter. The filter may include a combiner cavity filter receiving the RF signal and providing an output RF signal and the predistorter compensates for cavity filter insertion loss characteristics. The predistortion linearized communication system preferably further comprises a channel filtering and pulse shaping module receiving the input signal and providing baseband filtering to the input signal. The predistortion linearized communication system preferably further comprises an interpolation circuit coupled between the filter passband predistorter and the up-conversion module.

In another aspect, the present invention provides a predistortion linearized communication system for amplifying a digital communication signal, comprising an input receiving a multi-carrier digital communication signal, an input processing module coupled to the input and receiving the multi-carrier digital communication signal, the input processing module providing a plurality of sampled input signals. A plurality of digital up-converter circuit paths each receive a corresponding sampled input signal from the input processing module, each digital up-converter circuit path comprising a filter passband predistorter, the filter passband predistorter receiving a corresponding sampled input signal and outputting a predistorted signal, and an up-conversion module coupled to the filter passband predistorter receiving the predistorted signal and outputting up-converted digital signal. The predistortion linearized communication system further comprises a summer module receiving the up-converted digital signals from each of the digital up-convertor circuit paths and providing a multi-carrier composite signal, a filter group delay predistorter receiving the multi-carrier composite signal and providing a group delay compensated signal, and a digital to analog convertor coupled to the filter group delay predistorter receiving the group delay compensated signal and outputting a RF signal. A passband filter is coupled to the digital to analog convertor receiving the RF signal and outputting a passband RF signal. Each of the filter passband predistorters outputs the predistorted signals based on the characteristics of the passband filter relative to the multi-carrier digital communication signal.

In a preferred embodiment, the predistortion linearized communication system further comprises a combiner cavity filter receiving the passband RF signal and providing an output RF signal. Each of the digital up-convertor circuit paths preferably further comprises a channel filtering and pulse shaping module receiving the corresponding sampled input signal and providing baseband filtering to the sampled input signal. Each of the digital up-convertor circuit paths preferably further comprises an interpolation circuit coupled between the filter passband predistorter and the up-conversion module. Each of the filter passband predistorters preferably comprises a finite impulse response filter. Each of the finite impulse response filters preferably has 5 taps. The filter group delay predistorter preferably comprises an infinite impulse response filter. Each of the filter group delay predistorters preferably comprise an all-pass infinite impulse response filter. The predistortion linearized communication system preferably further comprises an uplink signal path coupled to the combiner cavity filter receiving uplink signals.

In another aspect, the present invention provides a method for predistortion linearization of a transmitter. The method comprises receiving a digital communication signal, providing a predistorted signal based on the digital communication signal employing digital predistortion coefficients, and providing an up-converted digital signal based on the predistorted signal. The method further comprises providing an RF signal based on the up-converted signal, and providing passband filtering by a passband filter on the RF signal. The digital predistortion coefficients are based on the characteristics of the passband filter and the communication signal frequency.

In a preferred embodiment the method for predistortion linearization further comprises providing group delay predistortion compensation on the up-converted signal.

Further features and aspects of the invention are set out in the following detailed description.

DETAILED DESCRIPTION OF THE INVENTION

One or more embodiments solve the above described negative effects of the narrow band pass filters in the output of a BS PA and improves the output spectrum. In a preferred embodiment, this is achieved by digitally predistorting baseband signals in the Digital Up-Conversion ("DUC") chain of the predistorter depending on the CDMA ("WCDMA") carrier position ("Fc") relative to filter roll-off characteristic.

Figure 1:
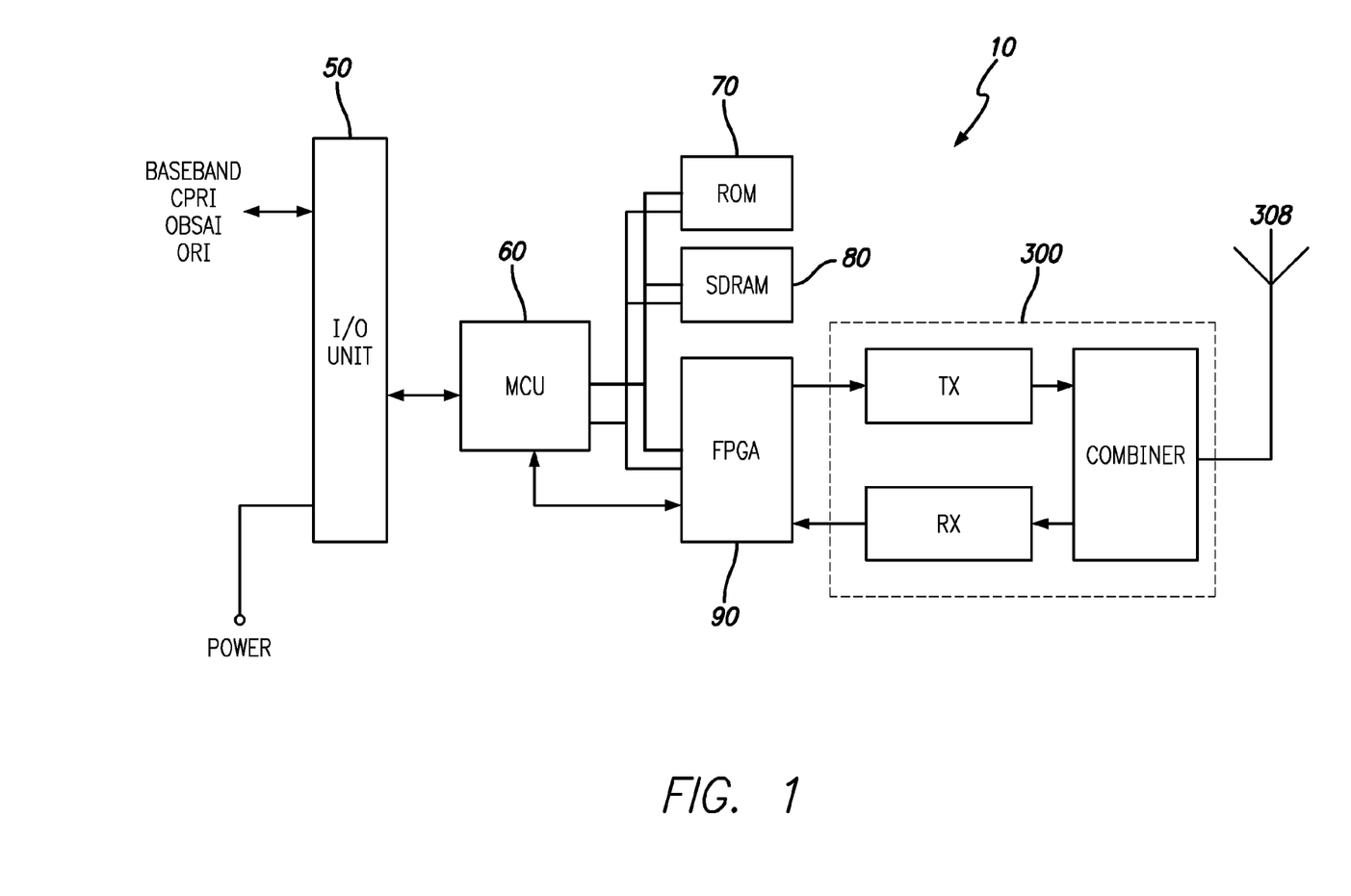
FIG. 1 is a block schematic diagram of a digitally predistortion controlled transceiver.

One or more embodiments are described below with reference to the figures. With reference to FIG. 1, a DPD linearized transceiver 10, which is also known as a remote radio head ("RRH"), for terrestrial wireless communication system is shown by way of a general system block diagram. As such it can support a number of air interface formats such as UMTS, CDMA-2000, IS-95, GSM, GPRS, WiMAX, HSPA, LTE, and other formats. Generally, an RRH can be deployed in near proximity of the antenna 308 to minimize transmission line losses between output combiner 306 and antenna 308. The RRH is provided with power source connection and data connection to a base station server ("BSS," not shown) which is connected to a core network. In common practice, a 2G/3G/4G base station is connected to the RRHs with a fiber optical connection. Either CPRI or OBSAI (other formats can be used) may be used to carry RF and operational control data to and from the RRH to provide wireless coverage in a dedicated geographic area. The RRH is equipped with a suitable I/O Unit 50 to provide flexible digital interfacing and processing functions between BSS and RRH. Microcontroller unit ("MCU") 60 is provided to perform data routing, control, and configuration duties within the RRH. Numerous architectures and implementations can be successfully used for MCU 60 suitable for RRH operation. In general, the MCU 60 is provided with non volatile memory storage such as ROM 70 where operating system, programs and fixed parameters maybe stored along with a SDRAM 80 used for real time computational requirements of MCU 60. For DPD functions along with uplink ("UL") and observation path receiver decoding are provided in a field programmable gate array ("FPGA") 90. It should be noted that FPGA 90 can be replaced with a custom designed application specific integrated circuit ("ASIC") which may incorporate many if not all functions programmed into FPGA as a part of its circuits. Unfortunately, a fully custom ASIC precludes any subsequent changes to algorithms or control flow changes offered by conventional FPGA. Insomuch, recent development of new class of ASIC have made transition from fully programmable FPGA to semi custom (or fully custom) ASIC easier by providing a combination ASIC-FPGA IC allowing DPD implementation some degree of freedom in case if changes are required. Detailed description of the FPGA 90 will be covered later on.

Figure 2:
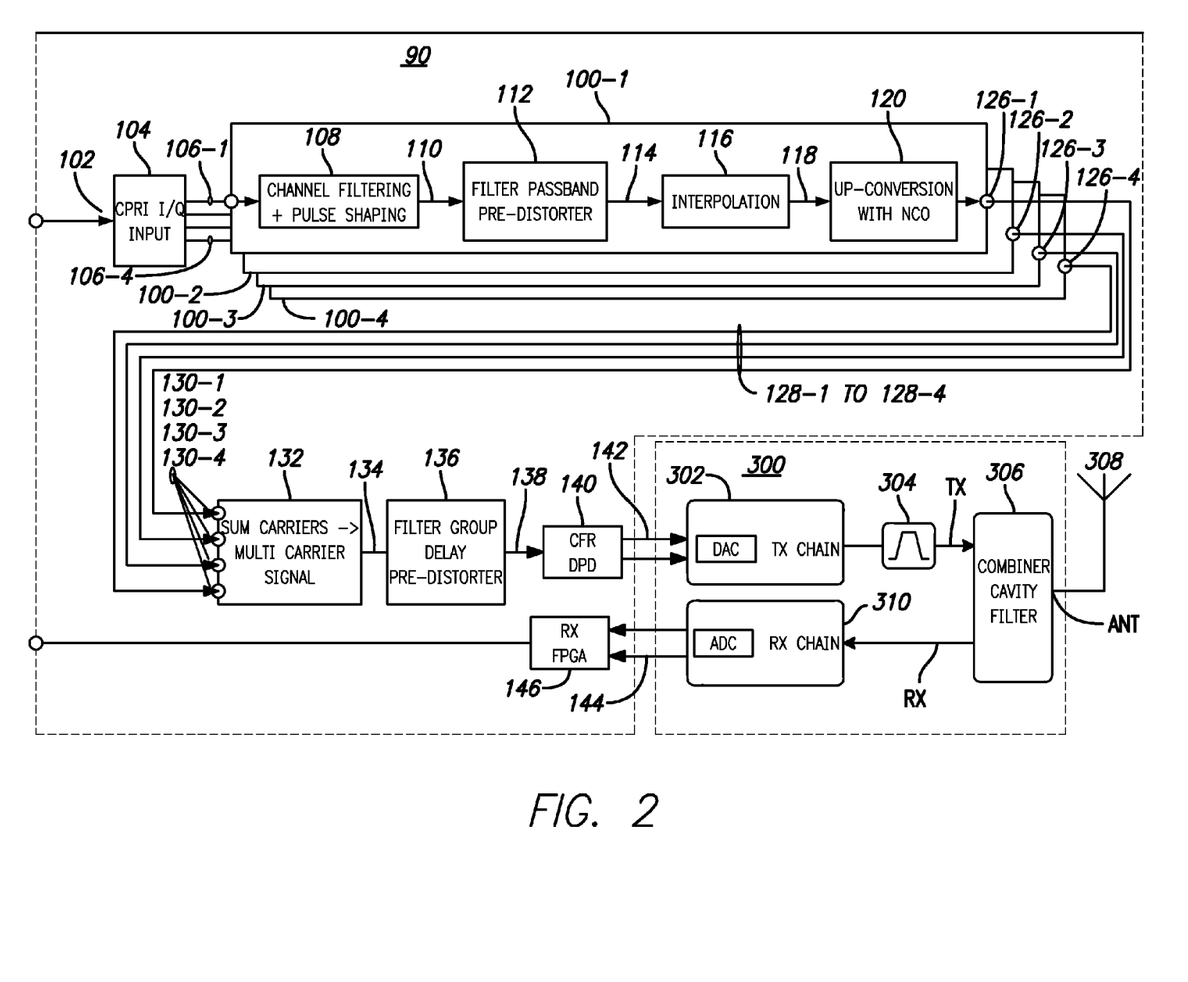
FIG. 2 is a block schematic diagram of exemplary functional elements used in the pre-distortion system.

Now with reference to FIGS. 1 and 2, the FPGA 90 provides down link ("DL") outputs 142 to TX module 302 of the digital to RF transceiver 300. It should be noted that RF transceiver 300 can be equipped to provide multiple transmit path, such as to support 2×2 or 4×4 MIMO, but only one transmit path is shown for the sake of clarity. Furthermore, other well known features of DPD such as an observation receive path which is used by DPD to correct the output nonlinearity in the PA output signal have been omitted. The output of the TX chain is coupled into output duplexer 306 such that RRH TX signals are further coupled to a common transmit receive antenna 308. Coincidently, received uplink ("UL") path signals are coupled from antenna 308 through the duplexer 306 to RX chain 310. Again, as in case of TX chain, only one RX chain is shown, but it shall be understood that a plurality of RX chains can be used to support 2×2, 4×4 MIMO or auxiliary sector augmentation receivers can be implemented as required. The digital output 144 of RX chain 310 is coupled to RX FPGA 146 portion of the FPGA 90 such that received UL signals are processed and routed via RRH BSS interface to a core network.

The digital functionality of the RRH has been implemented in the FPGA 90 which contains logic elements ("LEs") multipliers and embedded memory. Processed RF baseband data is received from I/O unit 50 into input of one of several digital upconverter chains ("DUC") 100. Depending on RRH deployment configuration, there maybe one or more DUC, each used with a specific RF carrier frequency. The received composite RF baseband 102 data is coupled into I/Q input processing module 104 which selectively routes I/Q samples to respective DUC 100-1 to 4 depending on RF carrier frequency and provides channel filtering designed for bandwidth of 1.25 MHz. Alternative channel bandwidth filtering is readily possible depending on transmission signal standard. Outputs 106-1 to 4 of CPRI I/Q input processing module 104 are coupled into channel filter—pulse shaper module 108. The Channel Filtering+ pulse shaping module 108 provides baseband filter characteristics specified in the CDMA 2000 standard. The output 110 of the Channel Filter—pulse shaper module 108 is coupled to Filter Passband Predistorter ("FPPD") module 112 which provides inverse amplitude waveform predistortion based on carrier location relative to filter roll-off characteristic. This will be described later on. It should be noted that FPPD module 112 can be positioned after interpolation 116, but this will result in increased number of logic gates needed to implement FPPD 112. The output 114 of FFPD module 112 is coupled into interpolation module 116 with its output 118 coupled to numerically controlled oscillator ("NCO") up conversion module 120. The output of each DUC 100-1 to n 126-1 to 126-4 is routed 128-1 to n to inputs 130-1 to 130-4 of a summer module 132 where a multi-carrier composite signal 134 is further processed through Filter Group Delay Predistorter 136 module ("FGDPD"). Filter Group Delay Predistorter 136 module provides inverse group delay characteristic into a multicarrier signal stream so as to remove group delay deviation present in the output combiner duplexer 306. Filter Group Delay Predistorter 136 module output 138 is coupled into crest factor ("CFR") and Digital predistortion ("DPD") module 140 before being coupled 142 into Digital to Analog Converter of the TX chain 302 to be converted and amplified to a desired RF signal.

Figure 3:
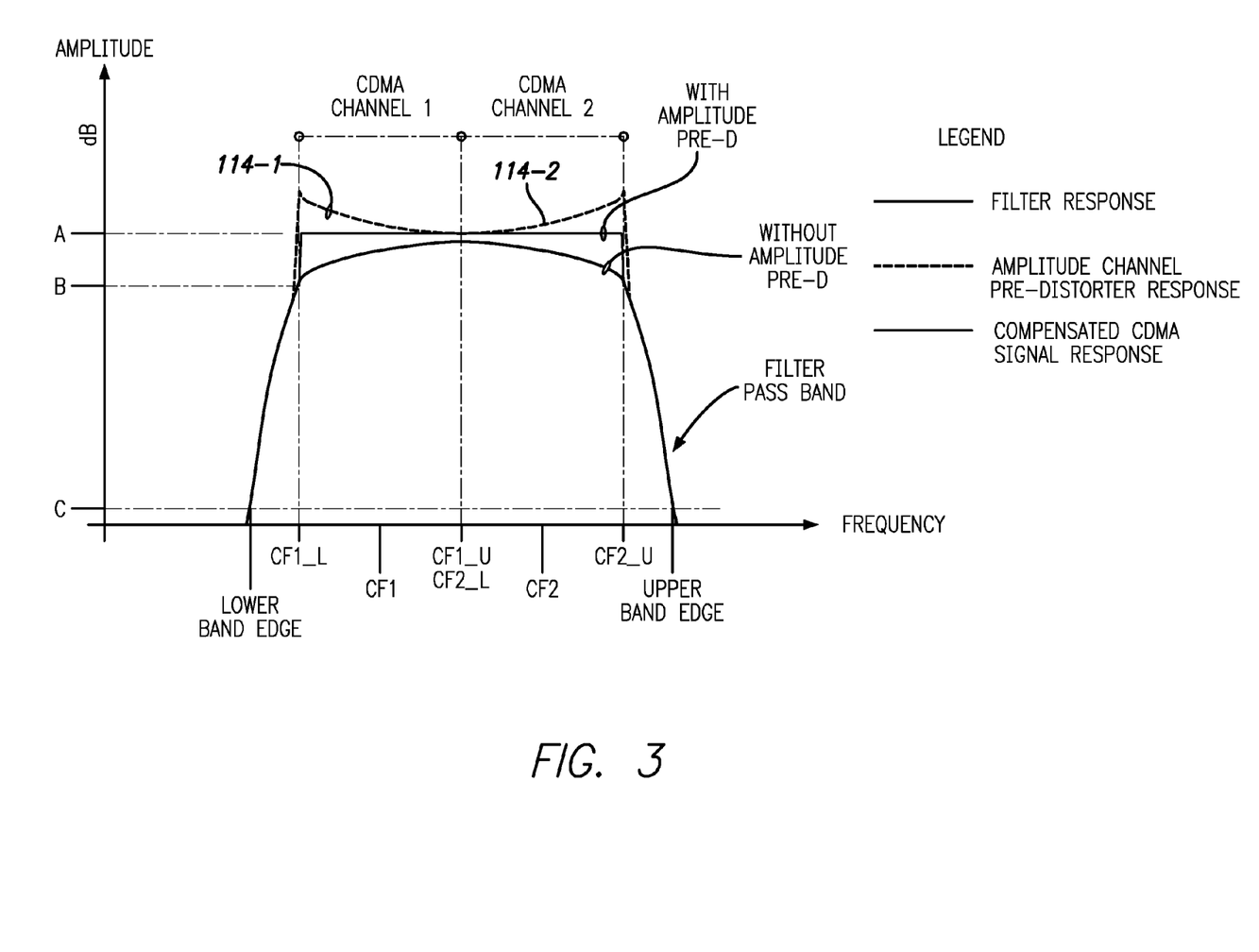
FIG. 3 is a representation of a frequency response plot of output band pass filter and compensation provided by DPD.
Figure 5:
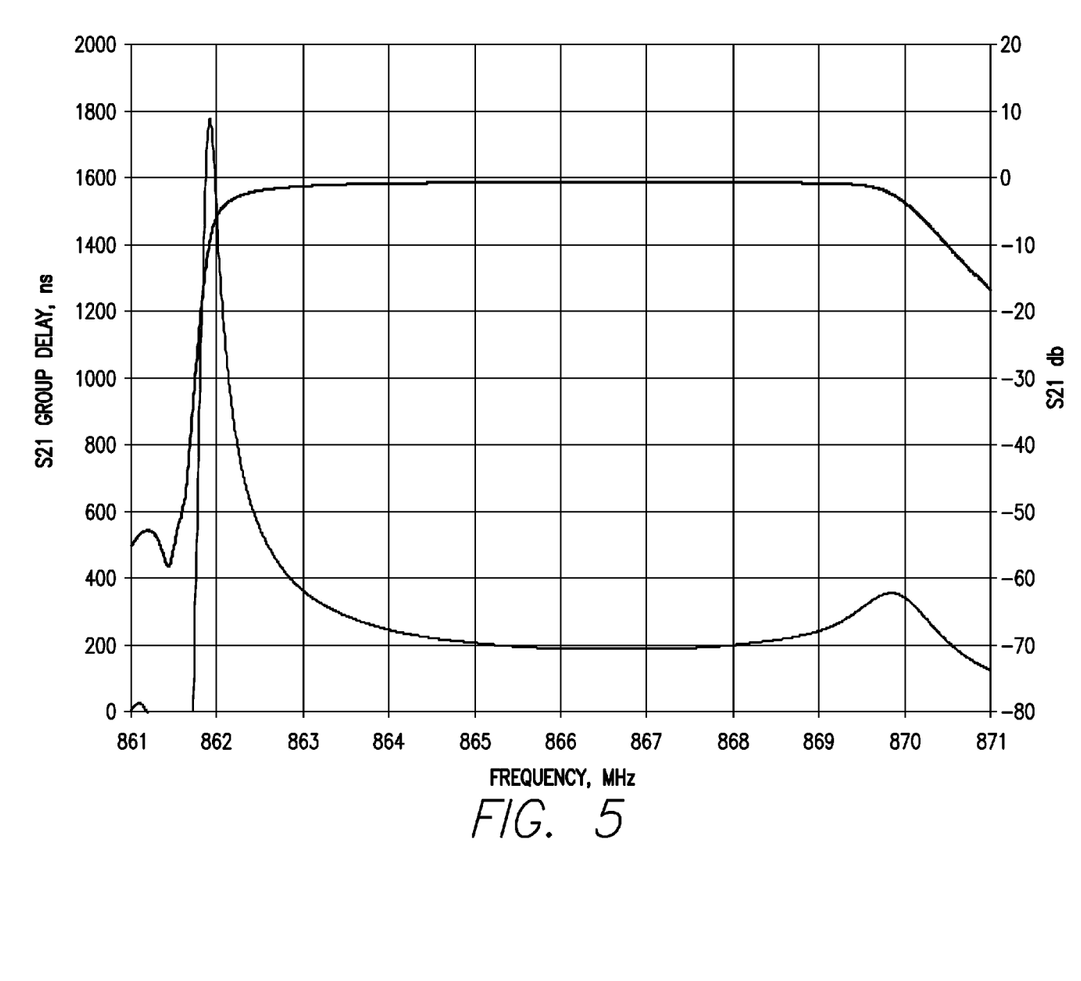
FIG. 5 is a representation of simulated amplitude and group delay characteristics (S21) of a narrow band-pass filter (Cellular 850).

With reference to FIG. 3 a two carrier IS-95 CDMA deployment scenario is presented by way of example, however deployment of two adjacent CDMA carriers is not a limiting factor and any number or types (i.e. IS-95 with LTE) of carriers can be deployed. In FIG. 5, a TX to ANT duplexer filter characteristics (S21 loss and S21 group delay) are depicted for operation in DL TX band allocated between 862.275-868.725 MHz, while UL RX signals are 817 to 824 MHz range. Rejection of TX signals in 824-861.5 MHz is specified at 50 dB Min.

| TX to ANT | 817-824 | 100 dB Min |
|---|---|---|
| TX to ANT | 824-861.5 | 50 dB Min |
| TX to ANT | 875-880 | 20 dB Min |
| TX to ANT | 880-900 | 35 dB Min |
| TX to ANT | 900-2700 | 65 dB Min |

| Tx Ripple | TX to ANT | 862.275-863.525 | 2.0 dB Max |
|---|---|---|---|
| Tx Ripple | TX to ANT | 863.525-868.725 | 0.45 dB Max |

Figure 4:
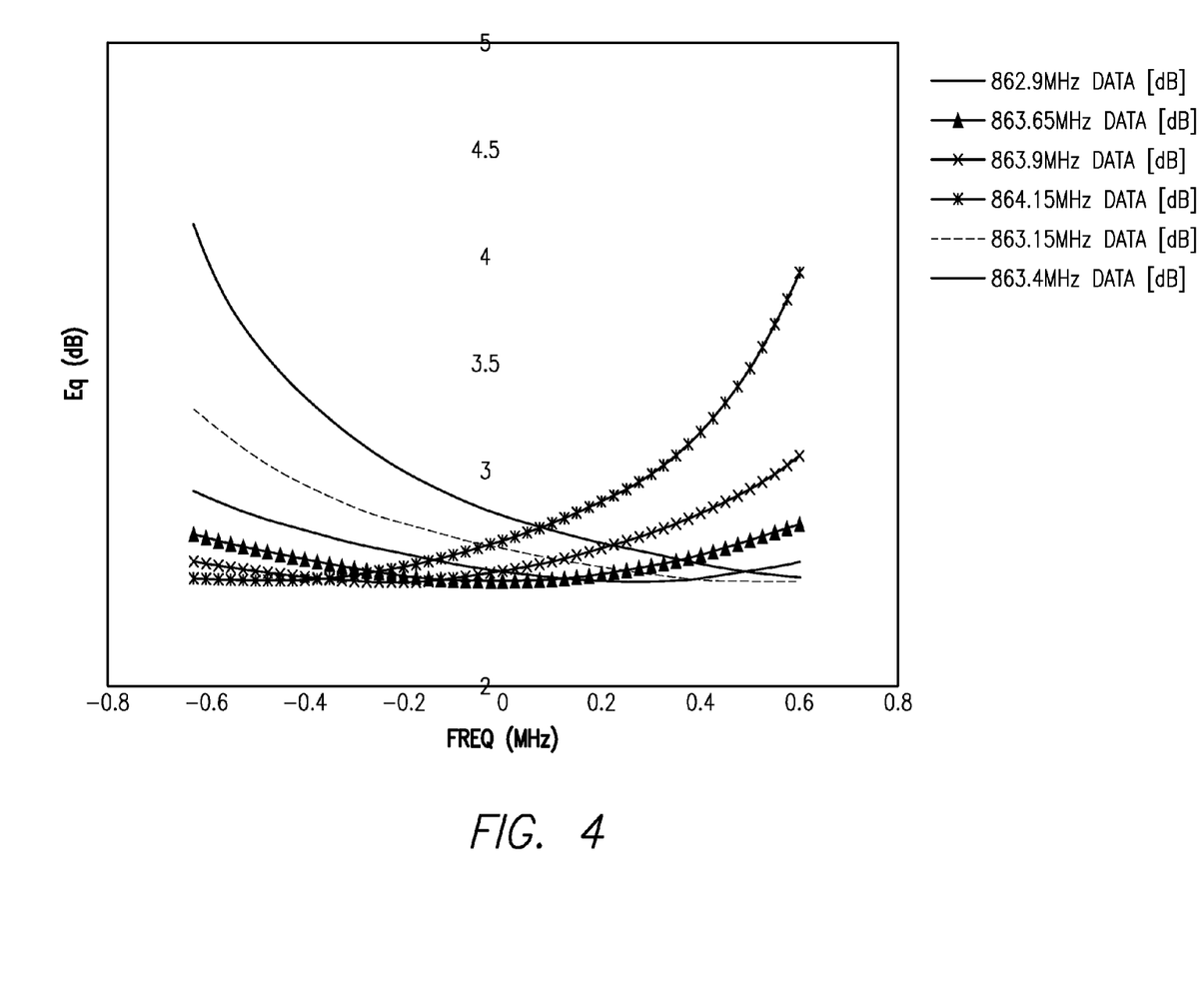
FIG. 4 is a representation of calculated amplitude DPD required for low frequency positioned CDMA carrier depending on the CF1 offset from the low or high band edge.

When such duplexer 306 is introduced in the output of the TX chain 302, the Rho ("ρ") of the CDMA transmitted signal, especially at 862.90 MHz, is substantially impaired. This impairment is caused by filter S21 insertion loss and group delay ripple between 862.275 and 863.525 MHz. To compensate for the filter characteristics, embodiments utilize digital predistortion means to compensate for filter's S21 insertion loss and group delay ripple. Each DUC 100-1 to n includes digital filter passband predistorter module 112 in it signal processing chain. Since the carrier frequency processed by a specific DUC 100-1 to n is known the amount of amplitude correction provided by filter passband predistorter module 112 can be calculated based on filter roll-off characteristic and frequency of the CDMA carrier. An array of amplitude correction curves are depicted in FIG. 4 which can be selected by FPPD 112 depending on operational requirements.

Figure 2A:
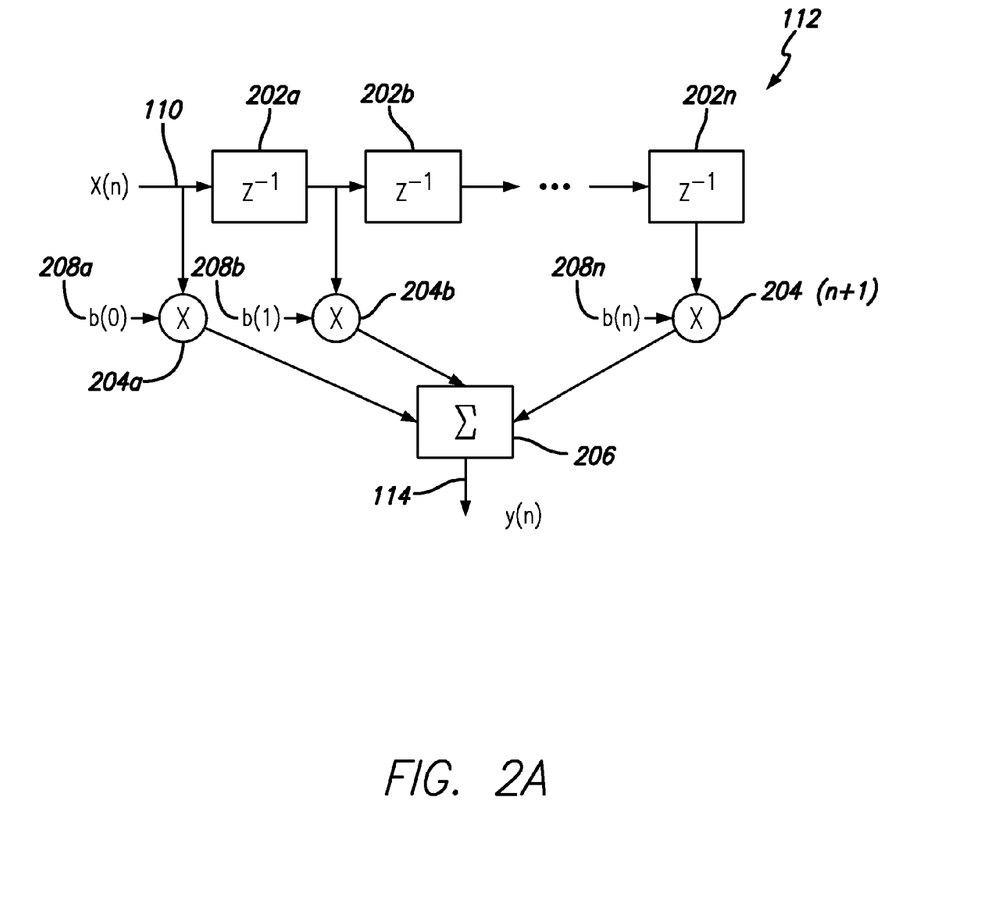
FIG. 2A is a block schematic diagram of a Passband predistorter implemented with a complex FIR ("finite impulse response") filter structure in an embodiment.

As shown in FIG. 2A, the FPPD 112 has a complex finite impulse response filter structure and takes complex weighted input samples x(n) 110 and has complex weighted output samples y(n) 114 with a transfer function H(z) such that y(n) is equal to x(n) convolved with H(z) following the equation below. Where:

n is the number of taps (5 in this example),
b are the complex weighted coefficients, and
z is a delay by k samples (k is integer).

$$H(z) = \sum_{k=0}^{n} b(k) z^{-k}$$

FIG. 2A depicts an exemplary Passband predistorter 112. The input x(n) 110 is coupled to the input of the $Z^{-1}$ unit 202a and the multiplier 204a. Multiplier 204a multiplies the input 110 and coefficient b(0) 208a and outputs the product to adder 206. The output of $Z^{-1}$ unit 202a is coupled to the input of $Z^{-1}$ unit 202b and multiplier 204b. Multiplier 204b multiplies the input of $Z^{-1}$ unit 202b and coefficient b(1) 208b, and outputs the product to adder 206. The circuit may be expanded to include additional taps. $Z^{-1}$ unit 202n outputs the signal to multiplier 204(n+1) which multiplies the signal with b(n) 208n and provides an output to adder 206. Adder 206 sums the respective signals and provides the output y(n) 114.

It shall be understood that numerous methods known to the skilled in the art are available to generate such filter compensation curves, together with adjustments for duplexer to duplexer variations, temperature compensation and the like, as required, to maintain acceptable Rho performance.

One or more embodiments preferably utilizes 5 tap FIR predistortion correction filter in the DUC 100 chain to normalize amplitude response introduced by the narrow band-pass filter 304 and to a lesser degree output duplexer 306. Examples will be made with reference to a DPD linearized PA operating in cellular 850 band specifically between 862.275 to 863.525 MHz, however it shall be understood that frequency of operation is matter of engineering choice and not a limitation of the one or more embodiments.

Similarly, group delay compensation for the duplexer TX to ANT passband is provided by FGDPD module 136 by employing an all-pass IIR filter to generate group delay compensation on the combined multi carrier signal 134. Similarly, FGDPD module 136 can be moved elsewhere in the FPGA 90 or distributed among DUC 100-1 to 4 chains if required.

Figure 2B:
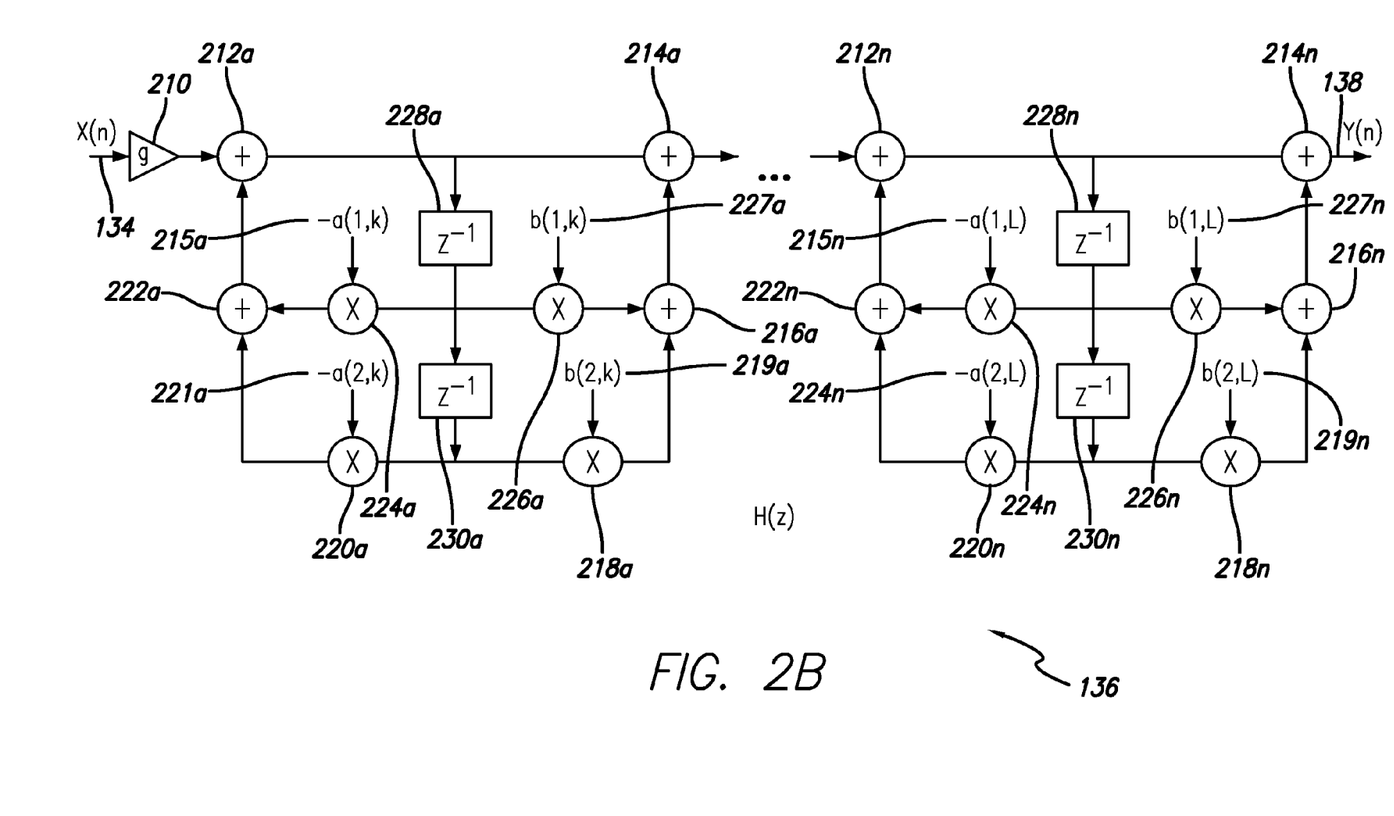
FIG. 2B is a block schematic diagram of a Filter Group Delay Predistorter module implemented with IIR ("infinite impulse response") all-pass filter structure in an embodiment.

As depicted in FIG. 2B, the FGDPD 136 has an infinite impulse response all-pass filter structure and may be represented in its second order section. The FGDPD 136 takes complex weighted input samples x(n) and has complex weighted output samples y(n) with a transfer function H(z) such that y(n) is equal to x(n) convolved with H(z) following the equation below. Where g is a compensating complex scalar gain value,
L is the number of taps (5 in this example),
a, b are the complex weighted coefficients (poles and zeros), and
z is a delay by a sample of k (k=1 to L).

$$H(z) = g \prod_{k=1}^{L} \frac{1 + b_{1k}z^{-1} + b_{2k}z^{-2}}{1 + a_{1k}z^{-1} + a_{2k}z^{-2}}$$

As depicted in FIG. 2B, the input X(n) 134 is coupled to the input of amplifier 210. The output of amplifier 210 is coupled to a path of adders 212a, 214a, and so on to include 212n and 214n. The output of adder 212a is also fed to $Z^{-1}$ unit 228a which in turn outputs a signal to both $Z^{-1}$ unit 230a and to a first path comprising multiplier 224a which multiplies the signal with coefficient −a(1,k) 215a and feds the product into adder 222a. The output of adder 222a is coupled to adder 212a. The $Z^{-1}$ unit 228a also provides an output to multiplier 226a which multiplies the signal with coefficient b(1,k) 227a which in turn provides an output to adder 216a. The $Z^{-1}$ unit 230a outputs a signal to a path comprising a multiplier 220a which multiplies the signal with coefficient −a(2,k) 221a and feds the output to adder 222a. The $Z^{-1}$ unit 230a also outputs a signal to a path comprising a multiplier 218a which multiplies the signal with coefficient b(2,k) 219a and feds the output to adder 216a. The output of adder 216a is coupled to adder 214a.

The circuit may be replicated in one or more embodiments. In the last stage, the output of adder 212n is also fed to $Z^{-1}$ unit 228n which in turn outputs a signal to both $Z^{-1}$ unit 230n and to a path comprising multiplier 224n which multiplies the signal with coefficient −a(1,L) 215n and feds the product into adder 222n. The output of adder 222n is coupled to adder 212n. The $Z^{-1}$ unit 228n also provides an output to multiplier 226n which multiplies the signal with coefficient b(1,L) 227n which in turn provides an output to adder 216n. $Z^{-1}$ unit 230n outputs a signal to a path comprising a multiplier 220n which multiplies the signal with coefficient −a(2,L) 215n and feds the output to adder 222n. The $Z^{-1}$ unit 230n also outputs a signal to a path comprising a multiplier 218a which multiplies the signal with coefficient b(2,L) and feds the output to adder 216n. The output of adder 216n is coupled to adder 214n.

The effectiveness of the compensation can be found in the table below.

CDMA IS-95 carrier FC=862.90 MHz

| Rho ("ρ") | Compensation |
| --- | --- |
| 0.985 to 0.990 | All compensation ON |
| 0.975 to 0.985 | Filter pass band OFF; group delay ON |
| 0.968 to 0.975 | Filter pass band ON; group delay OFF |
| 0.950 to 0.970 | Filter pass band OFF; group delay OFF |

Figure 6:
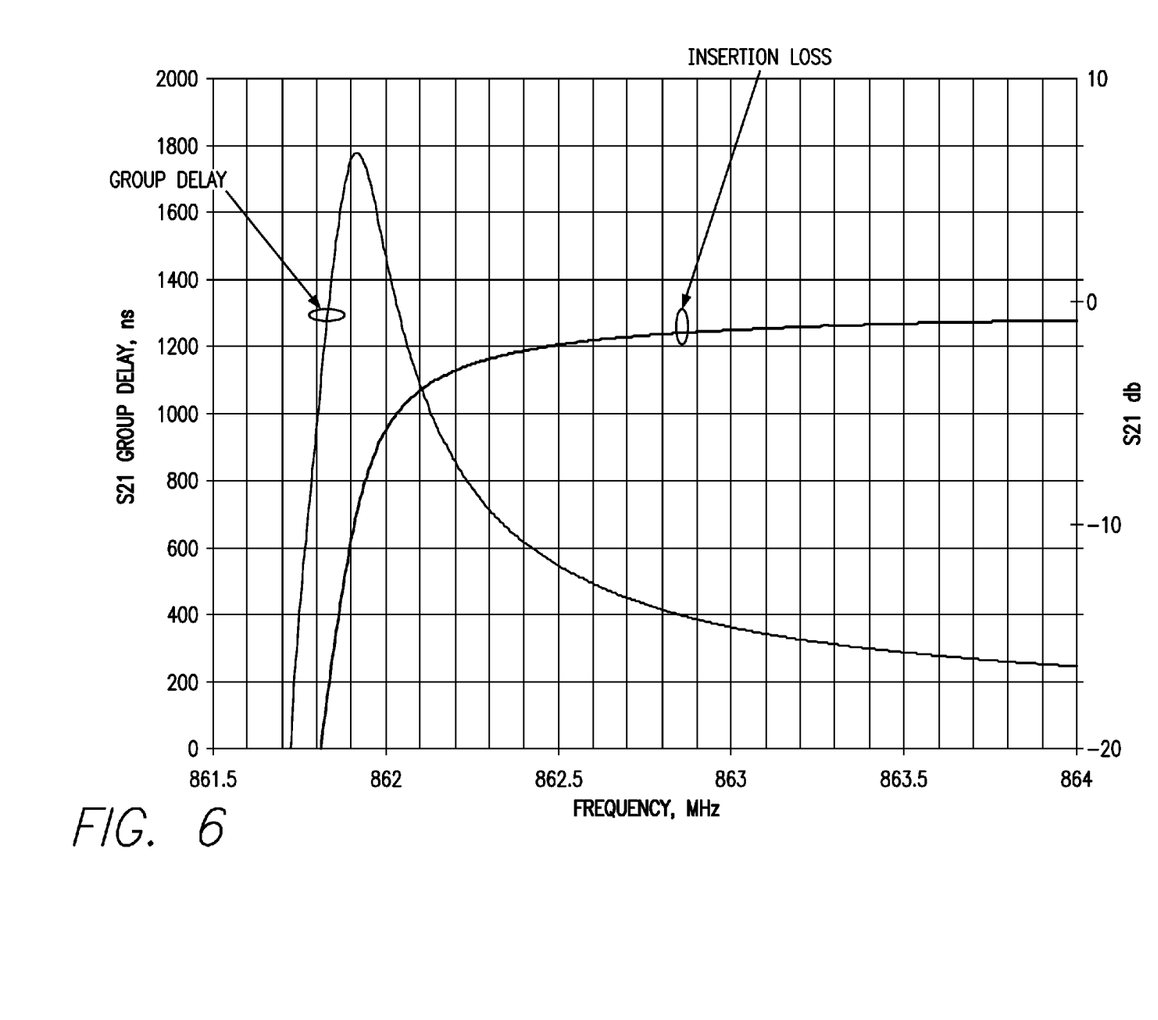
FIG. 6 is a representation of simulated amplitude and group delay characteristic low frequency detail of a narrow band-pass filter (Cellular 850).
Figure 7:
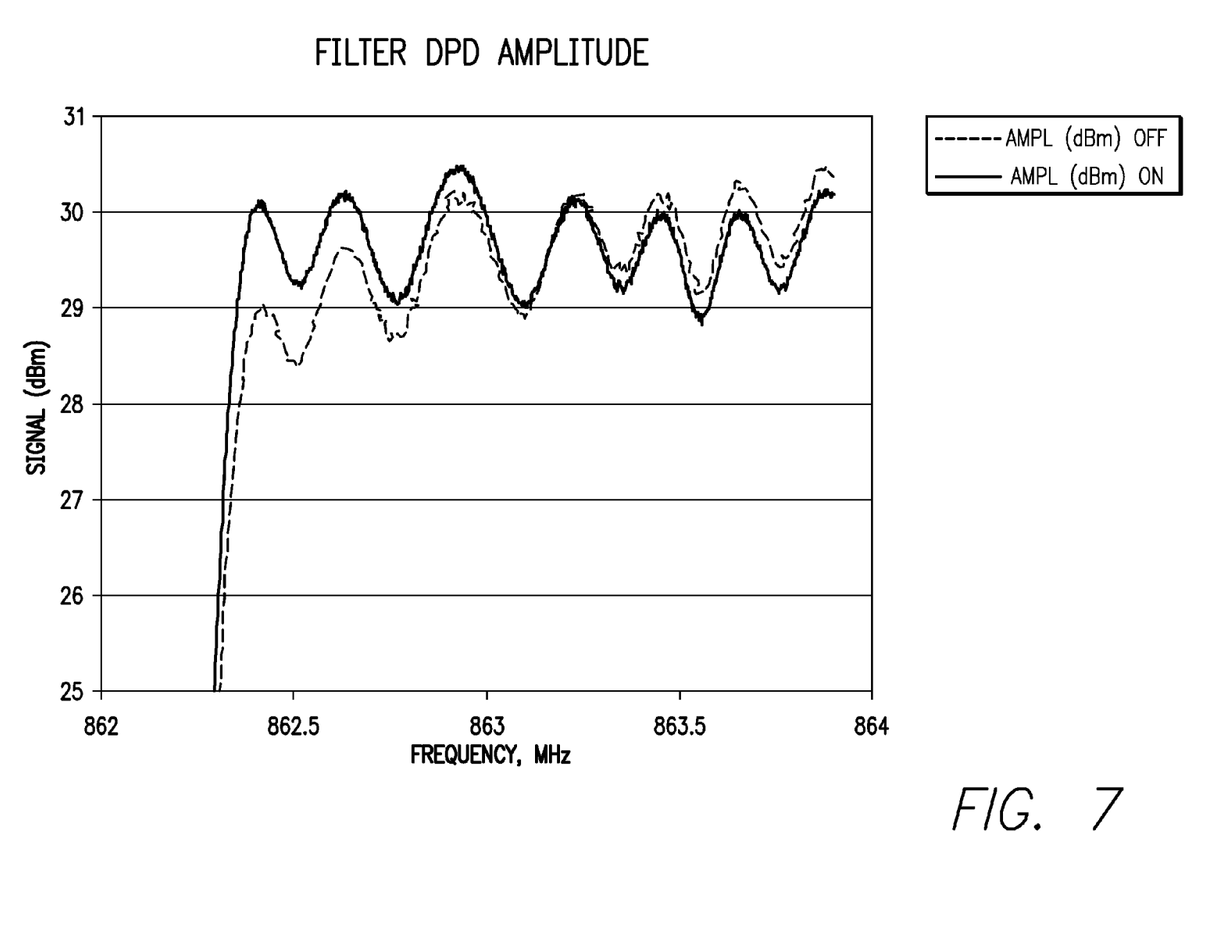
FIG. 7 is a simulation of the FPPD effect on the output spectrum flatness.

The filter passband predistorter compensation 112 can be observed on the output spectrum, but group delay compensation 136 effect can be quantified by signal quality—Rho ("ρ"). FIG. 6 is a representation of simulated amplitude and group delay characteristic low frequency detail of a narrow band-pass filter (Cellular 850). FIG. 7 is a simulation of the FPPD effect on the output spectrum flatness.

The present invention has been described primarily as structures and methods for employing digital predistortion to improve passband filter performance. The description is not intended to limit the invention to the form disclosed herein. Accordingly, variants and modifications consistent with the following teachings, skill, and knowledge of the relevant art, are within the scope of the present invention. The embodiments described herein are further intended to explain modes known for practicing the invention disclosed herewith and to enable others skilled in the art to utilize the invention in equivalent, or alternative embodiments and with various modifications considered necessary by the particular application(s) or use(s) of the present invention.

REFERENCE LABEL LIST

Item Description
- 10 Remote radio head (RRH)
- 50 I/O Unit
- 60 Microcontroller Unit (MCU)
- 70 Read Only Memory ROM (non volatile memory-flash memory)
- 80 Dynamic random access memory SDRAM
- 90 Field programmable gate array (FPGA) or semi custom ASIC
- 100 Digital Up Converter (DUC) one or more −1; −2; −n
- 102 DUC input port
- 104 CPRI I/O filtering and processing
- 106 Output of 104
- 108 Channel Filtering+pulse shaping module
- 110 Output of 108
- 112 (FPPD) Filter Passband Predistorter
- 114 Output of 112
- 116 Interpolation module
- 118 Output of 116
- 120 Numerically controlled (NCO) up conversion
- 126 DUC(s) output ports
- 128 DUC to multicarrier summer
- 132 Multicarrier summer—signal generation
- 134 Output of 132
- 136 FGDPD—Filter group delay predistortion
- 138 Output of 136
- 140 CFR Crest Factor Reduction and DPD digital predistortion
- 142 Output of 140
- 300 RF transceiver (300).
- 302 TX module (or chain) includes observation path for DPD (140)

306 Duplexer
308 Transmit—receive antenna
310 Receive Chain
144 Digital output (ADC) from Receive Chain (310) to FPGA
146 Receive FPGA block(s)
202$a$-$n$ $Z^{-1}$ unit
204$a$-$n$ Multiplier
206 Adder
208$a$-$n$ Coefficients
210 Amplifier
212$a$-$n$ Adder
214$a$-$n$ Adder
215$a$-$n$ Coefficients
216$a$-$n$ Adder
218$a$-$n$ Multiplier
219$a$-$n$ Coefficients
220$a$-$n$ Multiplier
221$a$-$n$ Coefficients
222$a$-$n$ Adder
224$a$-$n$ Multiplier
226$a$-$n$ Multiplier
227$a$-$n$ Coefficients
228$a$-$n$ $Z^{-1}$ unit
230$a$-$n$ $Z^{-1}$ unit

What is claimed is:

1. An apparatus of a device for wireless communication, the apparatus comprising:
predistortion circuitry to pre-distort digital baseband samples for a plurality of component carriers and generate a predistorted baseband signal for each component carrier, the predistortion circuitry to perform amplitude correction based on a roll-off characteristic associated with the component carriers;
combiner circuitry to generate a digital multicarrier signal from the predistorted baseband signals;
group-delay (GD) predistortion circuitry to provide an inverse group delay characteristic to the multicarrier signal;
crest-factor reduction (CFR) circuitry to reduce a crest factor of the multicarrier signal after operation of the GD predistortion circuitry; and
transceiver circuitry to generate an orthogonal frequency division multiplexed (OFDM) signal, from the multicarrier signal, for each component carrier, for transmission, after CFR.

2. The apparatus of claim 1 wherein the GD predistortion circuitry comprises an all-pass infinite impulse response (IIR) filter.

3. The apparatus of claim 2 wherein the transceiver circuitry comprises an output band-pass filter, and
wherein the IIR filter of the GD predistortion circuitry is configured to compensate for group delay of the band-pass filter.

4. The apparatus of claim 3 wherein the predistortion circuitry comprises a complex finite impulse response (FIR) filter structure that is configured to compensate for an amplitude response of the band-pass filter.

5. The apparatus of claim 4 wherein the complex FIR filter structure is configured to provide inverse amplitude waveform predistortion based on location of each component carrier relative to a roll-off characteristic of the band-pass filter.

6. the apparatus of claim 3 wherein the transceiver further includes an output combiner duplexer, and
wherein the IIR filter of the GD predistortion circuitry to generate group delay compensation to compensate for group delay deviation present in the output combiner duplexer.

7. The apparatus of claim 6 wherein the output combiner duplexer is configured to be coupled to one or more antennas.

8. The apparatus of claim 3 further comprising a digital to analog converter (DAC) to convert the multicarrier signal, after CFR, to an analog signal for subsequent generation of a radio-frequency signal,
wherein the output band-pass filter is configured to filter the radio-frequency signal prior to transmission.

9. The apparatus of claim 8 wherein the CFR circuitry is configured to reduce a peak-to-average power ratio (PAR) of the multicarrier signal.

10. The apparatus of claim 1 wherein, the predistortion circuitry to perform amplitude correction based on a roll-off characteristic associated with each of the component carriers.

11. A method, performed by processing circuitry and transceiver circuitry, the method comprising:
pre-distorting digital baseband samples for a plurality of component carriers to generate a predistorted baseband signal for each component carrier, the pre-distorting comprising an amplitude correction based on a roll-off characteristic associated with the component carriers;
generating a digital multicarrier signal from the predistorted baseband signals;
imposing an inverse group delay (GD) characteristic to the multicarrier signal;
reducing a crest factor of the multicarrier signal after imposing the inverse GD; and
generating an orthogonal frequency division multiplexed (OFDM) signal, from the multicarrier signal, for each component carrier, for transmission, after reducing the crest factor.

12. The method of claim 11 wherein imposing an inverse GD characteristic is performed by an all-pass infinite impulse response (IIR) filter.

13. The method of claim 12 wherein the ER filter is configured to compensate for group delay of a band-pass filter.

14. The method of claim 13 wherein the pre-distorting is performed by a complex finite impulse response (FIR) filter structure that is configured to compensate for an amplitude response of the band-pass filter.

15. The method of claim 14 wherein the complex FIR filter structure is configured to provide inverse amplitude waveform predistortion based on location of each component carrier relative to a roll-off characteristic of the band-pass filter.

16. The method of claim 13 wherein pre-distorting further comprises generating group delay compensation to compensate for group delay deviation present in an output combiner duplexer.

17. The method of claim 13 further comprising converting the multicarrier signal, after reducing the crest factor, to an analog signal for subsequent generation of a radio-frequency signal,
wherein the output band-pass filter is configured to filter the radio-frequency signal prior to transmission.

18. The method of claim 17 wherein reducing the crest factor comprises reducing a peak-to-average power ratio (PAR) of the multicarrier signal.

19. The method of claim 11 wherein the pre-distorting further comprises:

performing amplitude correction based on a roll-off characteristic associated with each of the component carriers.

20. An apparatus of a wireless communication device, the apparatus comprising:
predistortion circuitry to pre-distort digital baseband samples for each of a plurality of component carriers and generate a predistorted baseband signal for each component carrier, the predistortion circuitry to perform amplitude correction based on a roll-off characteristic associated with each component carrier;
combiner circuitry to generate a digital multi carrier signal from the predistorted baseband signals;
group-delay (GD) predistortion circuitry to provide an inverse group delay characteristic to the multicarrier signal;
crest-factor reduction (CFR) circuitry to reduce a crest factor of the multicarrier signal after operation of the GD predistortion circuitry; and
transceiver circuitry, including an output band-pass filter, to generate an orthogonal frequency division multiplexed (OFDM) signal, from the multicarrier signal, for each component carrier, for transmission, after CFR.

21. The apparatus of claim 20 wherein the GD predistortion circuitry comprises an all-pass infinite impulse response (IIR) filter configured to compensate for group delay of the band-pass filter, and
wherein the predistortion circuitry comprises a complex finite impulse response (FIR) filter structure that is configured to compensate for an amplitude response of the band-pass filter.

22. The apparatus of claim 21 wherein the complex FIR filter structure is configured to provide inverse amplitude waveform predistortion based on location of each component carrier relative to a roll-off characteristic of the band-pass filter.

* * * * *